United States Patent [19]

Galbraith

[11] Patent Number: 5,371,414
[45] Date of Patent: Dec. 6, 1994

[54] SIMULTANEOUS MULTIPLE ANTIFUSE PROGRAMMING METHOD

[75] Inventor: Douglas C. Galbraith, Fremont, Calif.

[73] Assignee: Actel Corporation, Sunnyvale, Calif.

[21] Appl. No.: 67,381

[22] Filed: May 26, 1993

[51] Int. Cl.$^5$ ............................................. H01H 37/76
[52] U.S. Cl. ....................................... 327/525; 365/96; 437/922
[58] Field of Search ............................ 307/202.1, 465; 437/170, 922; 365/96

[56] References Cited

U.S. PATENT DOCUMENTS

| | | | |
|---|---|---|---|
| 4,758,745 | 7/1988 | Elgamal et al. | 307/465 |
| 5,008,855 | 4/1991 | Eltoukhy et al. | 365/96 |
| 5,130,777 | 7/1992 | Galbraith et al. | 365/96 |
| 5,221,865 | 6/1993 | Phillips et al. | 307/465 |
| 5,272,388 | 12/1993 | Bakker | 307/202.1 |
| 5,294,846 | 3/1994 | Paivinen | 307/202.1 |

*Primary Examiner*—Edward P. Westin
*Assistant Examiner*—Benjamin D. Driscoll
*Attorney, Agent, or Firm*—D'Alessandro, Frazzini & Ritchie

[57] ABSTRACT

A method for simultaneously programming a plurality of antifuses each having a first electrode connected to a common node and each having a second electrode connected to an isolated node electrically isolated from the nodes of each of the other antifuses includes the steps of precharging the common node and the isolated nodes to an intermediate voltage potential selected to minimize the stress on all antifuses; precharging the isolated nodes of selected ones of the antifuses to a first programming voltage potential placing a second programming voltage potential on said common node, the first and second programming voltage potentials selected such that the difference between them is sufficient to cause programming of said antifuses and such that said intermediate potential is substantially centered between them, waiting a predetermined amount of time; and measuring the current flowing between the common node isolated nodes. If the measured current indicates that the desired antifuse has not been programmed the programming process may be attempted a preselected number of times. After the selected antifuses have been programmed, they are individually soaked by passing a soaking current through them.

12 Claims, 3 Drawing Sheets

SIMULTANEOUS MULTIPLE ANTIFUSE PROGRAMMING METHOD

BACKGROUND OF THE INVENTION

1. Field of the Invention

The present invention relates to user-programmable circuit technology. More particularly, the present invention relates to antifuse technology and to methods for simultaneously programming a plurality of antifuses in a user-programmable circuit containing an array of antifuses.

2. The Prior Art

Antifuse structures, user-programmable integrated circuit architectures, and circuits and methods for programming antifuses in a user-programmable integrated circuit are known in the prior art. U.S. Pat. Nos. 4,823,181, 4,758,745, and 5,070,384 disclose illustrative antifuse structures, programming circuits and circuit architectures employing antifuses. U.S. Pat. Nos. 5,126,282 and 5,130,777 disclose illustrative methods for programming antifuses in userprogrammable integrated circuit structures.

Basically, an antifuse may be programmed by placing a programming potential, usually referred to as $V_{pp}$, across it to disrupt the antifuse material disposed between its two conductive electrodes and to thereby form a conductive low-resistance path between the two electrodes. Typical antifuse programming may be viewed as comprising two cycles. During a first portion of a programming cycle, often referred to as a "rupture" cycle, the antifuse material is initially disrupted to form a conductive path. After the antifuse material has been ruptured, a second portion of a programming cycle, often referred to as a "soak" cycle, current is allowed to flow through the ruptured antifuse material to lower the final resistance of the programmed antifuse. After the antifuse ruptures, current flows until both sides of the antifuse are at equal potential. This current can be very large since its amplitude is only limited by the small parasitic resistance of the circuit layout and the intrinsic antifuse resistance.

A high current causes a large amount of instantaneous power to be dissipated by the antifuse structure. Therefore, the energy available for an instantaneous discharge must be limited to a level low enough to prevent antifuse contacts and vias from being damaged, or circuit structures associated with the programming path from being melted. The amount of "instantaneous" energy that can be delivered by this current spike is limited by the effective capacitance in the discharge loop.

In some interconnect architectures employing antifuses, large numbers of "cross antifuses", i.e., antifuses disposed at the intersections of conductors running in horizontal and vertical directions, are connected to a single conductor. The capacitance of such a circuit structure increases as the number of cross antifuses connected to the single conductor.

In an antifuse-based architecture, such as an FPGA architecture, single conductors carrying one of the power supply rail voltages to which unused circuit inputs are to be terminated are commonly employed. These conductors are a worst-case example of a large capacitance resulting from many antifuses commonly connected to a single conductor. In an average FPGA array employing antifuses as the programming mechanism to interconnect logic module circuits together, over half of all inputs to the logic modules are tied off to a conductor carrying one of the power supply rail potentials.

If each logic module input has a characteristic capacitance of about 1 pF, then these conductors can have hundreds of picofarads of capacitance associated with them because of the hundreds of inputs which must be tied off in even the smallest FPGA arrays. As the size of integrated circuits containing these features increases, so does this capacitance. Depending on the programming scheme used to program the antifuses, the capacitance of these conductors will eventually be able to store enough energy to damage or destroy the antifuse structures.

According to widely used prior art antifuse programming methods, the rupture and soak cycles are combined. First the antifuse material is ruptured, and then the antifuse is stressed by maintaining DC or AC connections to the programming voltage power supply to allow soak current to begin flowing into the antifuse immediately after rupture. Due to the voltage drops on the programming devices, and the current limiting circuitry in the external electronics, this soak current eventually lowers the voltage on the large conductor. If an attempt is made to simultaneously program several antifuses on the same conductor, the current flowing through the first antifuse to rupture would lower the programming voltage for the remaining antifuses. A one-volt reduction in programming voltage can increase the programming time from three to ten times its intended duration. This problem is magnified when the second antifuse ruptures and begins to draw current.

Some existing antifuse architectures employ programming voltage transistors in such a way that when the antifuse ruptures, charge is redistributed between the unprogrammed antifuse capacitors located at intersecting conductors. Smaller capacitors experience larger voltage changes than do larger capacitances, so during rupture the interconnect conductors containing fewer antifuses can shift many volts while the interconnect conductors containing larger numbers of antifuses may hardly move ( i.e., much less than one volt). The programming devices usually have a $V_{Bll}$ value of about 10v. In some architectures, the $V_{ds}$ of the programming devices can exceed $V_{Bll}$ because the capacitance of the interconnect conductor is too small to prevent the voltage from instantaneously raising above $V_{Bll}$. Programming of antifuse architectures is thus capable of inadvertent destruction of programming transistors, as well as antifuses.

BRIEF DESCRIPTION OF THE INVENTION

According to the present invention, a method for simultaneously programming a plurality of antifuses each having a first electrode connected to a common node and each having a second electrode connected to an isolated node electrically isolated from the nodes of each of the other antifuses includes the step of precharging the common node and the isolated nodes to an intermediate voltage potential selected to minimize the stress on all antifuses; precharging the isolated nodes of selected ones of the antifuses to a first programming voltage potential; placing a second programming voltage potential on said common node, the first and second programming voltage potentials selected such that the difference between them is sufficient to cause programming of said antifuses and such that said intermediate potential is substantially centered between them; waiting a predetermined amount of time; and measuring the current following between the common node isolated nodes. If the measured current indicates that the desired antifuse has not been programmed, the programming process may be attempted a preselected number of times. After the selected antifuses have been programmed, they are individually soaked by passing a soaking current through them.

The programming approach of the present invention separates the rupture and soak cycles, thereby eliminating the programming voltage drop on the common node track caused by the soak current flowing through more than one ruptured antifuses, it is now possible to simultaneously program more than one antifuse during the rupture cycle, without increasing the antifuse stress time. In antifuse architectures which include a large number of antifuses connected to a common node, for example, for tying off unused gate inputs, the savings in programming time can be substantial.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
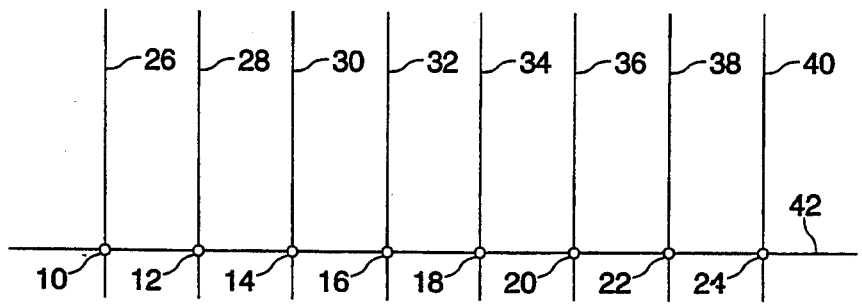
FIG. 1 is a simplified schematic diagram of a portion of an antifuse architectures showing a plurality of antifuses connected to a single circuit node.

Referring first to FIG. 1, a simplified schematic diagram of a portion of an antifuse architecture shows a plurality of antifuses connected to a single circuit node. In an actual embodiment of a circuit containing such antifuses, the plurality of antifuses 10, 12, 14, 16, 18, 20, 22, and 24 are used to selectively connect a plurality of conductors 26, 28, 30, 32, 34, 36, 38, and 40 to conductor 42. The environment of such a structure may be either general interconnect or may be employed, for example, to tie off unused circuit nodes to a voltage potential imposed on conductor 42.

From FIG. 1, it may be seen that use of conventional programming techniques may present difficulties if a large number of antifuses are to be programmed to make connections to conductor 42. For example, if antifuses 10, 12, 14, 16, and 18 are to be programmed, a programming voltage Vpp may be placed on conductor 42 and conductors 26, 28, 30, 32, and 34 may be placed at ground potential. The other conductors 36, 38, and 40 are placed at an intermediate potential, typical Vpp/2 in order to prevent stressing the antifuses 20, 22, and 24 which are to remain unprogrammed. As each antifuse programs, current is drawn from the Vpp power supply to ground through an increasing number of parallel paths. If the number of antifuses to be programmed is sufficiently large too much of a load may be placed on the vpp supply, thus lowering its output voltage to a value below the value necessary to reliably program the antifuses or requiring a programming current to large that it may destroy circuitry inside at the chip containing the antifuses.

The programming method of the present invention avoids this problem and allows an arbitrarily large number of antifuses to be programmed by rupturing them during a single rupture cycle. The antifuses may then be soaked individually, thus resulting in a significant reduction in overall programming time. The programming method of the present invention will be illustrated with reference to FIG. 2-5.

Figure 2:
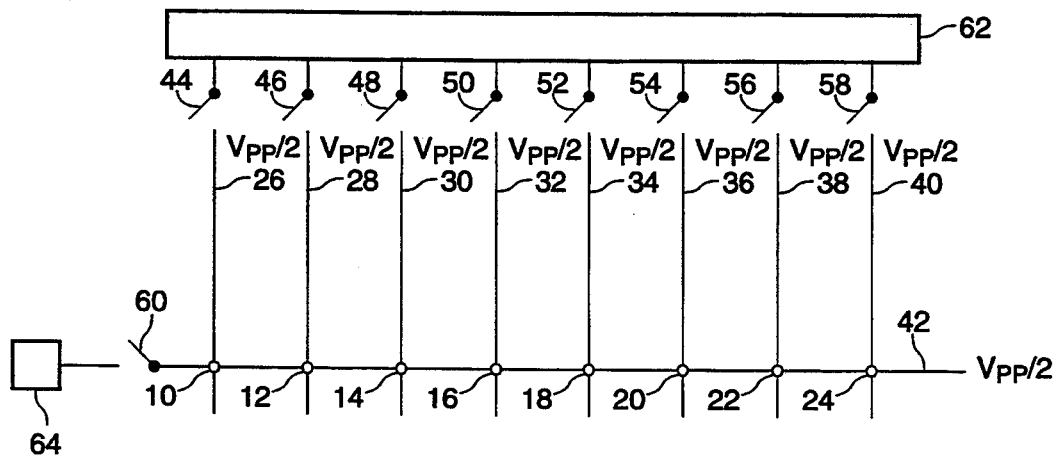
FIG. 2 is an equivalent schematic diagram of the architecture of FIG. 1 shown during a first portion of an antifuse programming cycle according to the present invention.

Referring now to FIG. 2, the circuit of FIG. 1 is redrawn to include switches 44, 46, 48, 50, 52, 54, 56, 58, and 60, used to connect conductors 26, 28, 30, 32, 34, 36, 38, 40, and 42 to various programming potentials delivered from programming circuitry depicted as blocks 62 and 64. Those of ordinary skill in the art will recognize that switches 44, 46, 48, 50, 52, 54, 56, 58, and 60 represent devices such as transistors typically disposed in the integrated circuit containing the circuitry of FIG. 1. Such programming circuitry may include charge pumps, steering circuitry from off chip programming voltage sources and the like. The architecture of such circuitry is well known to those of ordinary skill in the art and the details of particular programming circuitry is design dependent. The details of such circuitry forms no part of the invention and is omitted to avoid overcomplicating the disclosure. In the following discussion, it is assumed that it is desired to program antifuses 14, 16, 18, 20, and 22 and that antifuses 10, 12, and 24 are to remain unprogrammed.

First as shown in FIG. 2, all conductors 26, 28, 30, 32, 34, 36, 38, 40, and 42 have been dynamically charged to Vpp/2. This is accomplished by causing programming circuitry 62 and 64 to generate the voltage potential Vpp/2 and by closing switches 44, 46, 48, 50, 52, 54, 56, 58, and 60 for a period of time long enough to charge the inherent capacitances associated with conductors 26.28, 30, 32, 34, 36, 38, 40, and 42 to that voltage value. Switches 44, 46, 48, 50, 52, 54, 56, 58, and 60 are then reopened and, as shown in FIG. 2, all of the conductors 26, 28, 30, 32, 34, 36, 38, 40, and 42 have been charged to the potential Vpp/2. Those of ordinary skill in the art will recognize that the phrase "dynamically precharged" mens charging the conductor to the stated voltage and then removing the charging source to let the conductor "float" at the charged voltage.

Figure 3:
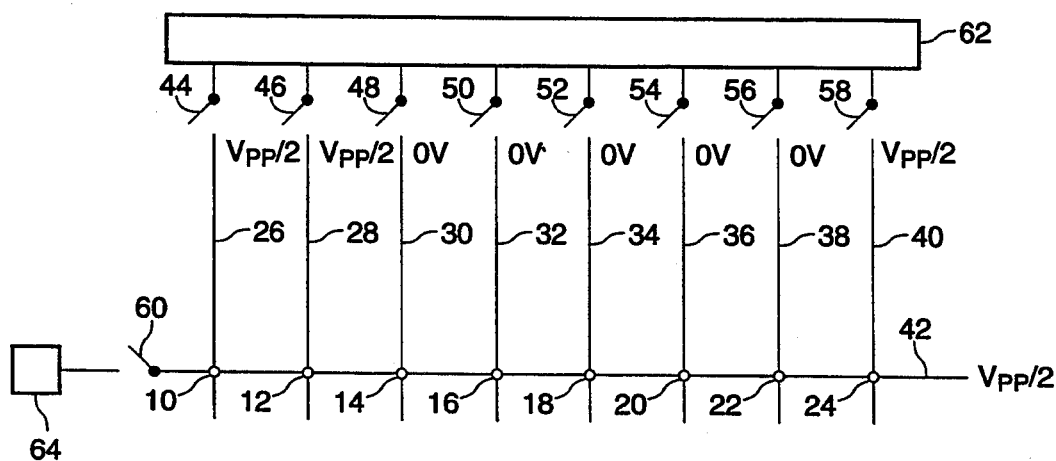
FIG. 3. is an equivalent schematic diagram of the architecture of FIG. 1 shown during a second portion of an antifuse programming cycle according to the present invention.

Referring now to FIG. 3, programming circuitry 62 is caused to generate 0 volts and switches 48, 50, 52, 54, and 56 are closed long enough to charge the capacitances associated with conductors 30, 32, 34, 36, and 38 to 0 volts. Switches 48, 50, 52, 54, and 56 are then reopened and, as shown in FIG. 3 all of the conductors 30, 32, 34, 36, and 38 have been charged to 0 volts.

Figure 4:
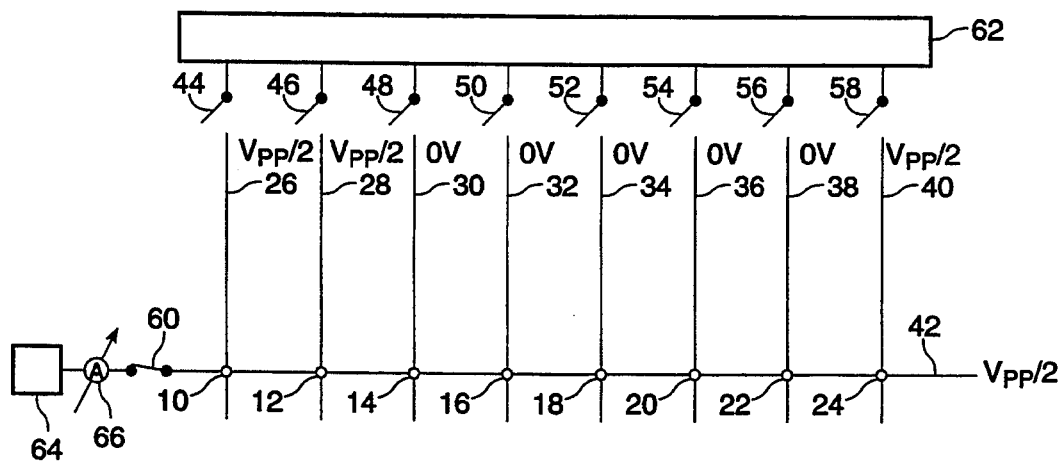
FIG. 4 is an equivalent schematic diagram of the architecture of FIG. 1 shown during a third portion of an antifuse programming cycle according to the present invention.

The conditions for the rupture cycle for antifuses 14, 16, 18, 20, and 22 is shown in FIG. 4. Programming circuitry 64 generates the potential Vpp and switch 60 is closed. Because conductors 30, 32, 34, 36, and 38 are charged to 0 volts, antifuses 14, 16, 18, 20, and 22 will be stressed and will program. Those of ordinary skill in the art will note that since conductors 30, 32, 34, 36, and 38 are isolated from one another, the programming of one of antifuses 14, 16, 18, 20, and 22 will not affect the potentials placed on the conductors associated with the other ones of the antifuses.

As each of antifuses 14, 16, 18, 20, and 22 programs, only enough current will be drawn from the Vpp supply in programming circuitry 64 to charge the one of the vertical conductors 30, 32, 34, 36, and 38 associated with the antifuse to the Vpp potential. No additional current will be drawn and thus, as each successive antifuse programs, the current drain on the Vpp supply will not be incrementally increased by creation of a new ground path.

Because conductors 26, 28, and 40 are charged to the potential Vpp/2, antifuses 10, 12, and 24 are not significantly stressed and will not program. Thus the rupture cycle for antifuses 14, 16, 18, 20, and 22 may be a single rupture cycle and the unselected antifuses will not be programmed.

After the antifuses have been stressed as shown in FIG. 4 for a predetermined amount of time calculated to be sufficient to program antifuses of the type employed, programming circuitry 64 lowers the voltage to Vpp/2 and switches 48, 50, 52, 54, and 56 are individually closed one at a time. The current drawn from the Vpp supply is measured as shown symbolically in FIG. 4 by ammeter 66 and compared with a value characteristic of a programmed antifuse. If the measured current for any of conductors 30, 32, 34, 36, or 38 indicates that the antifuse has not been programmed, the rupture cycle is repeated. The rupture cycle may be repeated a predetermined number of times before the unprogrammed antifuse is indicated as defective.

After successfully performing the rupture cycle as disclosed herein, other rupture cycles for antifuses connected to other common conductors may be performed. In typical FPGA architectures, hundreds of such cycles may be necessary to fully program the device as intended.

Figure 5:
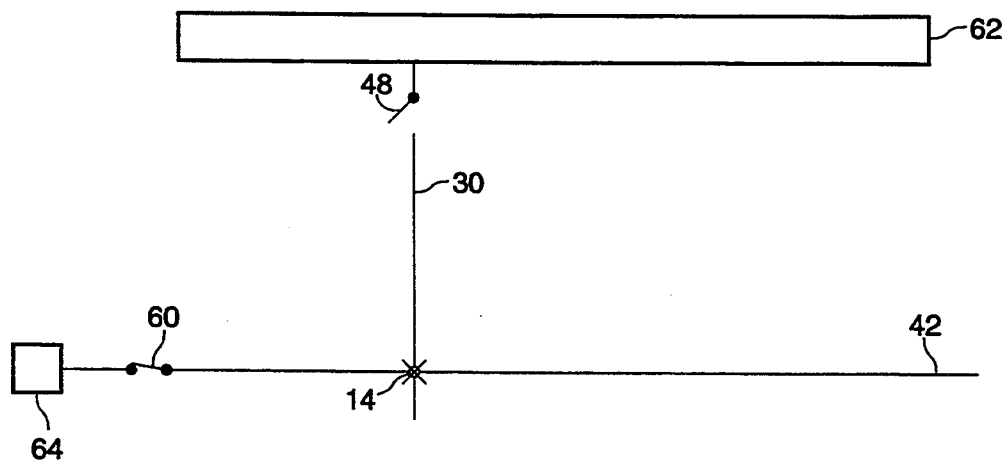
FIG. 5 is an equivalent schematic diagram of the architecture of FIG. 1 shown during a fourth portion of an antifuse programming cycle according to the present invention.

After all antifuses have been programmed, they are individually soaked as in the prior art programming process. This portion of the programming cycle is illustrated in FIG. 5 using antifuse 14 as an example. FIG. 5 illustrates a portion of the circuitry of FIGS. 1-4 showing conductors 30 and 42, antifuse 14, and programming circuitry 62 and 64. Programming circuitry 62 and 64 generate the soaking potential and switches 48 and 60 are closed. The soaking current may be applied as a DC current as disclosed in U.S. Pat. No. 5,008,855, or may be applied as an AC current as disclosed in U.S. Pat. No. 5,126,282. The magnitude of the soaking current will depend on the nature and compositor of the antifuse and may be easily selected by persons of ordinary skill in the art.

Figure 6:
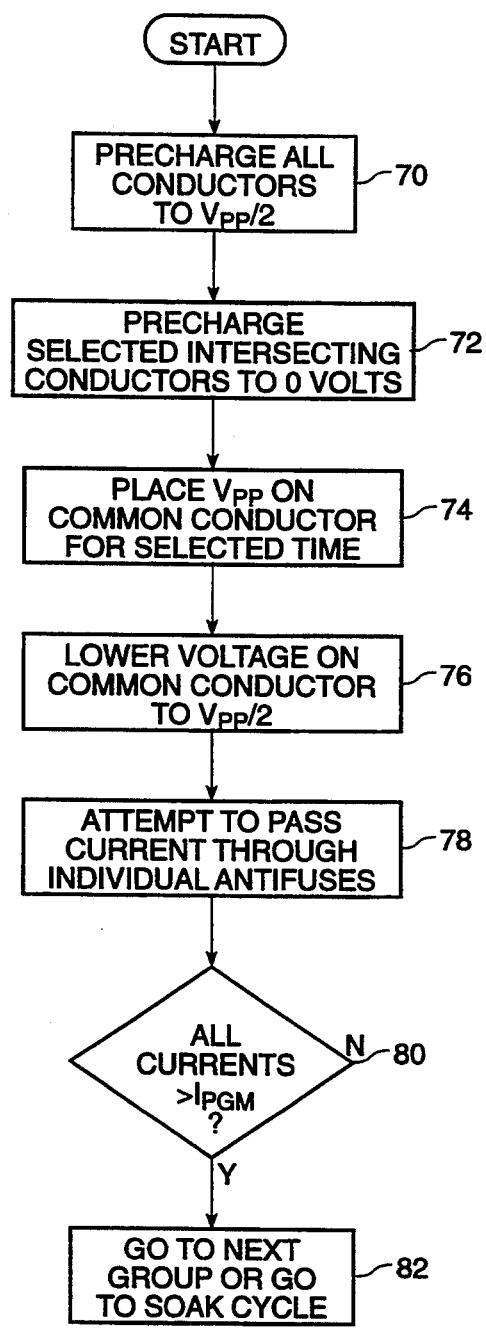
FIG. 6 is a flow diagram of typical antifuse programming cycle according to the present invention.

Referring now to FIG. 6, a flow diagram of the method of the present invention is shown. First, at step 70, the common conductor (reference numeral 42 in FIGS. 1-4) and all conductors which intersect it (reference numerals 26, 28, 30, 32, 34, 36, 38, and 40 in FIGS. 1-4) are dynamically precharged to Vpp/2. Next, at step 72, all intersecting conductors connected to antifuses to be programmed are dynamically precharged to 0 volts. At step 74, Vpp is placed on the common conductor for a selected time. The time selected is a time sufficient to program a functioning antifuse of the type employed in the circuit.

Next at step 76, after the selected amount of time has passed, the voltage on the common conductor is lowered to Vpp/2 in preparation for a verification procedure to determine if all antifuses have been programmed as intended. The verification procedure is performed at step 78, where an attempt is made to pass current through individual antifuses to see if they were programmed. Those of ordinary skill in the art will recognize that this step could be combined with the soak cycles for the antifuses, since the soaking cycles comprises passing soaking current through the individual antifuses to lower their final resistance.

Next at step 80, it is determined if all currents passed through the individual antifuses were large enough to indicate that the antifuses had been programmed. If not, the procedure returns to step 70. If so, the procedure advances to step 82. In step 82, the next group of antifuses is selected and programmed using steps 70-80 or, if no further groups of antifuses exist, the already ruptured individual antifuses are soaked to lower their final resistance.

There are several advantages to use of the present programming method. First, because the programming devices (represented by the switches 44, 46, 48, 50, 52, 54, 56, 58, and 60) are turned off during the rupture cycle, the maximum discharge capacitance is limited to a safe value.

In addition, a significant time savings may be achieved using the present invention. For example, if it is desired to connect a horizontal conductor to 1000 vertical conductors according to the present invention. All of the vertical conductors are discharged to zero volts, all of the other conductors are precharged to Vpp/2, and Vpp is applied to the horizontal conductors. As each cross antifuse ruptures, its vertical conductors will be pulled up to Vpp. The horizontal conductor will be held at Vpp since there is not any DC current to cause a voltage drop across the pull up device which typically supplies Vpp. Using the method of the present invention, it is possible to rupture many antifuses during a single programming cycle. In the present example, the time needed to rupture 1,000 antifuses has been compressed to the time needed to rupture 1 antifuse (a 1,000 to 1 reduction in rupture time).

In addition, since the programming device (i.e., switch) is off, then it cannot enter $V_{BII}$ and be destroyed during the rupture cycle. Therefore, turning off the programming devices during the rupture cycle also prevents them from being destroyed.

The programming method of the present invention removes $V_{BII}$ from list of variables that must be controlled when designing the segmentation devices in a typical antifuse-based interconnection array. This additional degree of freedom allows the device designer to improve the gain of the programming device, thus allowing improvements and/or simplifications in other areas of the integrated circuits containing the antifuses.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for programming a plurality of antifuses disposed at intersections between a common conductor and a plurality of individual crossing conductors, including the steps of:

dynamically precharging each one of the individual crossing conductors associated with antifuses not to be programmed to a voltage level equal to approximately half of a programming potential difference;

dynamically precharging each one of the individual crossing conductors associated with antifuses to be programmed to one potential of said programming potential difference; and placing a second potential of said programming potential difference to said common conductor for a time selected to be sufficient to program properly functioning antifuses.

2. The method of claim 1, further including the steps of:

reducing said second potential to a value selected to avoid stressing unprogrammed ones of said antifuses after said time has elapsed;

comparing the current passing through each antifuse to be programmed with magnitude of a current exhibited by a programmed antifuse; and repeating the steps of claim 1 only if the current passing through any one of said antifuses to be programmed is less than said magnitude of a current exhibited by a programmed antifuse.

3. The method of claim 1, further including the step of passing a soaking current through each one of said antifuses which has been programmed.

4. A method for programming a plurality of antifuses configured to program at a programming voltage potential, said antifuses disposed at intersections between a common conductor and a plurality of individual crossing conductors, including the steps of:

dynamically precharging each one of the individual crossing conductors associated with antifuses not to be programmed to a selected voltage level halfway between a first voltage potential and a second voltage potential, the difference between said first and second voltage potentials comprising said programming voltage potential;

dynamically precharging each one of the individual crossing conductors associated with antifuses to be programmed to said first voltage potential; and placing said second voltage potential on said common conductor for a time selected to be sufficient to program properly functioning antifuses.

5. The method of claim 4, further including the steps of:

reducing the voltage on said common conductor to said selected voltage potential after said time has elapsed;

comparing the current passing through each antifuse to be programmed with the magnitude of a current exhibited by a programmed antifuse; and repeating the steps of claim 4 only if the current passing through any one of said antifuses to be programmed is less than said magnitude of a current exhibited by a programmed antifuse.

6. The method of claim 4, further including the step of passing a soaking current through each one of said antifuses which has been programmed.

7. A method for programming a plurality of antifuses associated with a plurality of common conductors, individual ones of said disposed at intersections between one of said common conductors and a plurality of individual crossing conductors intersecting said one of said common conductors, including the steps of:

(1) selecting one of said common conductors;

(2) dynamically precharging each one of the individual crossing conductors associated with antifuses not to be programmed to connect said individual crossing conductors to said selected common conductor to a voltage level halfway between a first voltage potential and a second voltage potential, the difference between said first and second voltage potentials comprising said programming voltage potential;

(3) dynamically precharging each one of the individual crossing conductors associated with antifuses to be programmed to said first voltage potential;

(4) placing said second voltage potential to said common conductor for a time selected to be sufficient to program property functioning antifuses; and (5) repeating steps (1)–(4) for each one of said common conductors.

8. The method of claim 7, further including for each performance of steps (1)–(4) therein performance of the further steps of:

reducing said second voltage potential to a value selected to avoid stressing unprogrammed ones of said antifuses after said time has elapsed;

comparing the current passing through each antifuse to be programmed with the magnitude of a current exhibited by a programmed antifuse; and repeating the steps of claim 7 only if the current passing through any one of said antifuses to be programmed is less than said magnitude of a current exhibited by a programmed antifuse.

9. The method of claim 7, further including the step of passing a soaking current through each one of said antifuses which has been programmed.

10. A method for programming a plurality of antifuses associated with a plurality of common conductors, said antifuses configured to program at a programming voltage potential, individual ones of said antifuses disposed at intersections between one of said common conductors and a plurality of individual crossing conductors intersecting said one of said common conductors, including the steps of:

(1) selecting one said common conductors;

(2) dynamically precharging each one of the individual crossing conductors associated with antifuses not to be programmed to connect said individual crossing conductors to said selected common conductor to a selected voltage level halfway between a first voltage potential and a second voltage potential, the difference between said first and second voltage potentials comprising said programming voltage potential;

(3) dynamically precharging each one of the individual crossing conductors associated with antifuses to be programmed to said first voltage potential;

(4) placing said second voltage potential on said common conductor for a time selected to be sufficient to program properly functioning antifuses; and (5) repeating steps (1)–(4) for each one of said common conductors.

11. The method of claim 10, further including for each performance of steps (1)–(4) therein performance of the further steps of;

reducing said second potential to approximately said selected voltage potential after said time has elapsed;

comparing the current passing through each antifuse to be programmed with the magnitude of a current exhibited by a programmed antifuse; and repeating the steps of claim 10 only if the current passing through any one of said antifuses to be programmed is less than said magnitude of a current exhibited by a programmed antifuse.

12. The method of claim 10, further including the step of passing a soaking current through each one of said antifuses which has been programmed.

* * * * *

UNITED STATES PATENT AND TRADEMARK OFFICE
CERTIFICATE OF CORRECTION

PATENT NO.  : 5,371,414
DATED       : December 6, 1994
INVENTOR(S) : Douglas C. Galbraith It is certified that error appears in the above-indentified patent and that said Letters Patent is hereby corrected as shown below:

```
On column 1, line 22, replace "userprogrammable" with --user-programmable--
On column 2, line 45, replace "10v" with --10v--.
On column 3, line 30, replace "FIG 3." with --FIG. 3--.
On column 4, line 3, replace "typical" with --typically--.
On column 4, line 10, replace "vpp" with --Vpp--.
On column 4, line 50, replace "26.28" with --26, 28--.
On column 4, line 56, replace "mens" with --means--.
On column 5, line 56, replace "compositor" with --composition--.
On column 6, line 24, after "to" insert --the--.

On column 7, line 68, after "said" insert --antifuses--.
On column 8, line 19, replace "property" with --properly--.
```

Signed and Sealed this

Fourth Day of April, 1995

*Attest:*

BRUCE LEHMAN

*Attesting Officer*          *Commissioner of Patents and Trademarks*